United States Patent
Ionkin et al.

(10) Patent No.: US 8,709,657 B2
(45) Date of Patent: Apr. 29, 2014

(54) QUATERNARY CHALCOGENIDE WAFERS

(75) Inventors: Alex Sergey Ionkin, Kennett Square, PA (US); Brian M. Fish, Wilmington, DE (US)

(73) Assignee: E I du Pont de Nemours and Company, Wilmington, DE (US)

(*) Notice: Subject to any disclaimer, the term of this patent is extended or adjusted under 35 U.S.C. 154(b) by 318 days.

(21) Appl. No.: 12/963,979

(22) Filed: Dec. 9, 2010

(65) Prior Publication Data
US 2012/0145970 A1    Jun. 14, 2012

(51) Int. Cl.
*H01M 4/13* (2010.01)
*H01M 4/58* (2010.01)
*H01M 8/04* (2006.01)

(52) U.S. Cl.
USPC ............. 429/231.1; 429/218.1; 428/585

(58) Field of Classification Search
USPC ........ 252/519.34; 439/478; 429/231.1, 218.1; 428/585
See application file for complete search history.

(56) References Cited

U.S. PATENT DOCUMENTS

| 6,488,770 | B1 | 12/2002 | Meissner et al. | |
| 2011/0059361 | A1* | 3/2011 | Wilkening et al. | 429/218.1 |

FOREIGN PATENT DOCUMENTS

| CN | 101026198 A | 8/2007 |
| JP | 63076413 A | 4/1988 |
| JP | 02194519 A | 8/1990 |
| WO | 2010006623 A2 | 1/2010 |
| WO | WO2010/006623 * | 1/2010 |

OTHER PUBLICATIONS

Mellikov, E. et al., Monograin materials for solar cells, Solar Energy Materials & Solar Cells, 2009, pp. 65-68, vol. 93, Elsevier B.V.
Krustok, J. et al., Temperature dependence of $Cu_2ZnSn(Se_xS_{1-x})4$ monograin solar cells, Solar Energy, 2010, pp. 379-383, vol. 84, Elsevier Ltd.
Mellikov, E. et al., Powder materials and technologies for solar cells, International Journal of Materials and Product Technology, 2007, pp. 291-311, vol. 28, Nos. 3/4 , Inderscience Enterprises Ltd.
Altosaar, M. et al., Monograin Powders and Layers for Photovoltaic Application, Materials Research Society Symposium Proceedings, 1996, pp. 563-568, vol. 426, Materials Research Society.

* cited by examiner

*Primary Examiner* — Ling-Siu Choi
*Assistant Examiner* — Monique Peets

(57) ABSTRACT

Disclosed herein are processes for making quaternary chalcogenide wafers. The process comprises heating a mixture of quaternary chalcogenide crystals and flux and then cooling the mixture to form a solidified mixture comprising ingots of quaternary chalcogenide and flux. The process also comprises isolating one or more ingots of quaternary chalcogenide from the solidified mixture and mounting at least one ingot in a polymer binder to form a quaternary chalcogenide-polymer composite. The process also comprises optionally slicing the quaternary chalcogenide-polymer composite to form one or more quaternary chalcogenide-polymer composite wafers. The quaternary chalcogenide wafers are useful for forming solar cells.

4 Claims, 1 Drawing Sheet

QUATERNARY CHALCOGENIDE WAFERS

FIELD OF THE INVENTION

The present invention relates to quaternary chalcogenide wafers and processes for their preparation.

TECHNICAL BACKGROUND

Currently, most electric power-generating solar cells have silicon as as a light-absorbing, semiconducting material and are fabricated using relatively expensive production processes. To make solar cells economically viable, thin-film solar cells have been developed, which are based on thin-film, light-absorbing semiconductor materials, such as copper-indium-gallium-sulfo-di-selenide, $Cu(In,Ga)(S,Se)_2$, also termed CIGS. CIGS-based solar cells have demonstrated power conversion efficiencies exceeding 19%.

Despite the demonstrated potential of CIGS in thin-film solar cells, the toxicity and low abundance of indium and selenium are major impediments to the widespread use and acceptance of CIGS in commercial devices. An attractive alternative for absorber layers of thin-film solar cells is quaternary chalcogenides, particularly copper-zinc-tin-sulfide, $Cu_2ZnSnS_4$ (CZTS). CZTS has a direct bandgap of about 1.5 eV and an absorption coefficient greater than $10^4$ cm$^{-1}$. In addition, CZTS does not include any toxic or low abundance elements.

Thin films of CZTS have been prepared via sputtering of Cu, SnS, and ZnS precursors; hybrid sputtering; pulsed laser deposition; spray pyrolysis of halides and thiourea complexes; and thermal sulfurization of electrodeposited, e-beam deposited, or sol-gel deposited Cu—Zn—Sn precursors.

Bulk quantities of CZTS have been prepared in evacuated quartz ampoules at temperatures between 400° C. to 1150° C. Bulk quantities have also been prepared in a furnace with a source of sulfur, such as $H_2S$.

However, processes for providing CZTS and its chalcogenide analogs in wafer form have not been disclosed.

Hence, there is a need for a safe, robust process to produce CZTS and its chalcogenide analogs in wafer form for non-vacuum based thin-film solar cells.

SUMMARY

Disclosed is a process comprising:

(a) heating a mixture of quaternary chalcogenide crystals and flux at a temperature in the range of 450° C. to 850° C.;

(b) cooling the mixture to form a solidified mixture comprising one or more ingots of quaternary chalcogenide and flux;

(c) isolating one or more ingot of quaternary chalcogenide from the solidified mixture;

(d) mounting at least one ingot in a polymer binder to form a quaternary chalcogenide-polymer composite; and (e) optionally, slicing the quaternary chalcogenide-polymer composite to form one or more quaternary chalcogenide-polymer composite wafers.

Also, disclosed is an article having a top surface and a bottom surface, the article comprising at least one quaternary chalcogenide ingot mounted in a polymer binder, such that the at least one quaternary chalcogenide ingot is exposed on both the top surface and the bottom surface.

Figure 1:
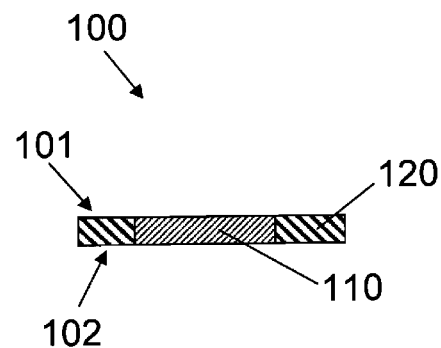
FIG. 1 schematically illustrates a cross-sectional view of a portion of an article comprising a quarternary chalcogenide ingot mounted in a polymer binder.
Figure 2:
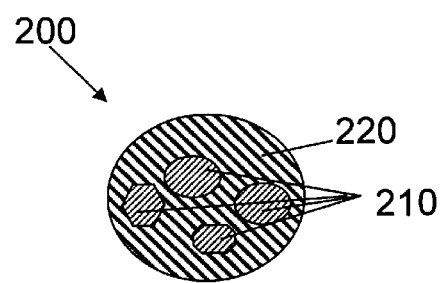
FIG. 2 schematically illustrates a top view of a portion of another article comprising a plurality of quarternary chalcogenide ingots mounted in a polymer binder.

Reference numerals shown in FIGS. 1-2 are explained below:

100, 200: article
101: top surface of the article
102: bottom surface of the article
110, 210: quarternary chalcogenide ingot(s)
120, 220: polymer binder

DETAILED DESCRIPTION

Disclosed is a process for making a quaternary chalcogenide wafer comprising heating a mixture of quaternary chalcogenide crystals and a flux at a suitable temperature for a suitable amount of time and then cooling the mixture to form a solidified mixture comprising one or more ingots of quaternary chalcogenide and flux. The process also comprises isolating one or more ingots of quaternary chalcogenide from the solidified mixture, mounting at least one ingot in a polymer binder to form a quaternary chalcogenide-polymer composite, and optionally, slicing the quaternary chalcogenide-polymer composite to form one or more quaternary chalcogenide-polymer composite wafers.

As used herein, the term "ingot" refers to single crystalline or polycrystalline quaternary chalcogenide particles having at least one dimension in the range of 0.1 mm to 50 cm or 5 mm to 10 cm.

In an embodiment, the quaternary chalcogenide crystals comprise $Cu_2ZnSnS_4$ (CZTS), $Cu_2ZnSn(S_a,Se_{1-a})_4$, where $0 \leq a \leq 1$ (CZTS/Se), or $Cu_2ZnSnSe_4$ (CZTSe). CZTS and its analogs (CZTSe and CZTS/Se) may also be doped by small amounts of other elements, such as alkali and alkali earth metals, wherein the dopants are typically derived from the chalcogen source.

Any suitable method can be used to make the quaternary chalcogenide crystals. For example, the quaternary chalcogenide crystals can be prepared by heating a reaction mixture comprising: a source of copper, e.g., copper sulfide; a source of zinc, e.g., zinc sulfide; a source of tin, e.g., tin(II) sulfide; a source of chalcogen (sulfur and/or selenium), e.g., metal sulfides such as copper sulfide, zinc sulfide, and tin(II)sulfide and/or metal selenides; and a flux, e.g., cesium chloride, in an inert atmosphere, such as under nitrogen flow at 750° C. for 24 hours. The molar ratio of copper:zinc:tin:chalcogen in the reaction mixture is 2:1:1:(4 or greater). The ratios of the copper, zinc, and tin can deviate from these integer values by up to 20 mole %. The quaternary chalcogenide crystals are isolated by first cooling the reaction mixture to ambient temperature in the flow of an inert gas, e.g., nitrogen, argon, helium, or a mixture of thereof. After cooling, the flux is removed from the reaction mixture by washing with a flux solvent, e.g., water, leaving the undissolved crystals of quaternary chalcogenide. The quaternary chalcogenide crystals can be dried, such as at 1-mm vacuum at room temperature for 12 hours or at elevated temperature up to 200° C.

In accordance with the present invention, there is provided a process. The process comprises mixing quaternary chalcogenide crystals and a flux in a weight ratio in the range of 10:1 to 1:10, or 5:1 to 1:5, or 1:1 to 1:2. The flux comprises an alkali halide, an alkaline earth halide, or a mixture thereof. The mixture of quaternary chalcogenide crystals and the flux is then heated in an inert gas at a temperature in the range of 450-850° C., or preferably at 750° C. for a time in the range of 1 hour to 5 days, or 12 hours to 5 days. In an embodiment, the mixture is heated in a tube furnace with nitrogen flow. After heating, the mixture is cooled to room temperature in an inert gas to obtain a solidified mixture of quaternary chalcogenide and flux. The process also comprises isolating one or more ingots of quaternary chalcogenide from the solidified mixture. Any suitable method, mechanical or chemical can be used for isolating the ingots. In an embodiment, ingots are isolated by dissolving the flux in a flux solvent, such as water, followed by filtering the ingots and drying in a vacuum at a temperature in the range of room temperature to 50° C. for 5 hour to 5 days, or 1 day to 3 days. The quaternary chalcogenide ingots can optionally be sieved through a suitable screen, e.g., 25 mesh screen (0.71 mm sieve size) to isolate bigger ingots.

The process further comprises mounting at least one ingot in a polymer binder to form a quaternary chalcogenide-polymer composite. Any suitable non-conductive polymer can be used as a polymer binder. Exemplary polymer binder includes epoxy, acrylic, polysiloxanes, or mixtures thereof. The process also comprises optionally slicing the quaternary chalcogenide-polymer composite to form one or more quaternary chalcogenide-polymer composite wafers. The wafers can have a thickness in the range of 10-300 microns or 10-150 microns or 10-45 microns.

In some embodiments, the process also comprises exposing at least one quaternary chalcogenide ingot on opposite sides of the composite wafer. Any suitable method can be used for exposing the at least one quaternary chalcogenide ingot, such as polishing or dissolving the polymer binder using a solvent.

FIG. 1 schematically illustrates a cross-sectional view of a portion of an article 100 having a top surface 101 and a bottom surface 102. As shown in FIG. 1, the article 100 comprises one quarternary chalcogenide ingot 110 mounted in a polymer binder 120, such that the quarternary chalcogenide ingot 110 is exposed on both the top surface 101 and the bottom surface 102. In an embodiment, the article is in the form of a wafer.

FIG. 2 schematically illustrates a top view of a portion of an article 200, in accordance with various embodiments. As shown in FIG. 2, the article 200 comprises a plurality of quarternary chalcogenide ingots 210 mounted in a polymer binder 220, such that at least one quarternary chalcogenide ingot 210 is exposed on both the top surface and the bottom surface.

The quaternary chalcogenide wafers comprising CZTS or its analogs (CZTSe and CZTS/Se) prepared by the process described above can be used in a broad range of semiconductor devices, although they are especially effective in light-receiving elements such as photodiodes and solar cells.

As used herein, the phrase "solar cell" is used interchangeably with "photovoltaic cell".

As used herein, the terms "comprises," "comprising," "includes," "including," "has," "having" or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), or both A and B are true (or present).

As used herein, the phrase "one or more" is intended to cover a non-exclusive inclusion. For example, one or more of A, B, and C implies any one of the following: A alone, B alone, C alone, a combination of A and B, a combination of B and C, a combination of A and C, or a combination of A, B, and C.

Also, use of "a" or "an" are employed to describe elements and described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the disclosed compositions, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

In the foregoing specification, the concepts have been disclosed with reference to specific embodiments. However, one of ordinary skill in the art appreciates that various modifications and changes can be made without departing from the scope of the invention as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all embodiments.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The concepts disclosed herein will be further described in the following examples, which do not limit the scope of the invention described in the claims.

The examples cited here relate to quaternary chalcogenide wafers used as absorber layer for solar cells. The discussion below describes how a chalcogenide wafer is formed.

EXAMPLES

All metal salts and reagents were obtained from commercial sources, and used as received, unless otherwise noted.

For the synthesis of CZTS crystals, Copper(II) sulfide, zinc(II) sulfide, tin(II) sulfide, all purchased from Alfa Aesar, and cesium chloride BDH, Molecular Biology Grade) was obtained from VWR International (West Chester, Pa.).

For the preparation of CZTS Ingots, CsCl (BDH, Molecular Biology Grade) was obtained from VWR International (West Chester, Pa.).

For the synthesis of CZTSe crystals and ingots, copper powder (99% purity with a particle size of 45 micron) and tin nanopowder (99% purity with a particle size (TEM) of less than 150 nm) were obtained from Sigma-Aldrich; nano-zinc (099% purity, agglomerated particles with a primary particle size (TEM) of 100 nm) was obtained from Umicore Inc. (Angleur, Belgium); selenium (99.999% purity) was obtained from Alfa Aesar; cesium chloride (CsCl) (BDH, Molecular Biology Grade) was obtained from VWR International (West Chester, Pa.); and potassium chloride (KCl) (99.0% purity) and sodium chloride (NaCl) (99.0% purity) were obtained from EMD Chemicals Inc. (Gibbstown, N.J.).

Epoxy set resin 145-20005 and epoxy set hardener 145-20020 were both obtained from Allied High Tech Products, Inc. (Rancho Dominguez, Calif.).

X-ray diffraction patterns were compared to standard patterns of CZTS available from International Centre for Diffraction Data (ICDD), located in Newtown Square, Pa.

Example 1

Preparation of CZTS Wafers

Step 1A: Synthesis of CZTS Crystals

Copper(II) sulfide (8.71 g, 0.091 mol), zinc(II) sulfide (4.44 g, 0.0456 mol), tin(II) sulfide (6.88 g, 0.0456 mol), and CsCl (50.0 g) were mixed together by shaking individual components for 15 min in a dry box to form a mixture. The mixture was placed in a 50 mL alumina boat, and heated in a tube furnace with nitrogen flow at 750° C. for 24 h. The furnace was cooled to room temperature and then the boat was removed and immersed in 500 mL of distilled water. Black crystalline material was filtered off, washed with an additional 500 mL of water, and dried at 1 mm vacuum for 12 h. The CZTS structure was confirmed by single X-ray analysis. The purity of CZTS crystals was evaluated by X-ray powder diffraction using Rietveld refinement and was found to be in the range of 95-99%.

Step 1B: Preparation of CZTS Ingots

CZTS crystals (20.0 grams) prepared supra and CsCl (20.0-40.0 grams) were placed in a 50-mL alumina boat. The alumina boat was placed in a quartz tube having a diameter of 6.35 cm (2.5 inches) under nitrogen flow. The mixture of CZTS and CsCl in the alumina boat was heated to 750-800° C. and kept at this temperature for 1 day. Upon cooling to ambient temperature, the solidified mixture had ingots of CZTS up to 1 cm in length, along with some crystalline and amorphous materials. The crystalline and amorphous materials comprised CZTS with some decomposition products, such as, copper sulfides, tin sulfides, and zinc sulfides. The crystalline and amorphous materials which were not ingots were discarded and not used in further experiments. The boat containing the solidified mixture was placed into 1 liter of distilled water to dissolve CsCl. The residue was washed twice with 500 mL of distilled water and dried in 1-mm vacuum for 24 h. Table 1 summarizes the amounts used, annealing temperature, and yields of four different batches. The CZTS ingots were mechanically removed using tweezers from the mixture to determine the yield for each experiment. Ingots from the four batches, 1A-1D were combined and the biggest ingots which did not go through a 24 mesh screen sieve (Scienceware® Mini-Sieve™ sieve set, No. F378451000) were used for further experiments.

TABLE 1

Preparation of Ingots

| Batch # | Amount of CZTS crystals (g) | Amount of CsCl flux (g) | Annealing Temperature (° C.) | # of days for annealing | Yield of Ingot (g) |
|---|---|---|---|---|---|
| 1A | 20 | 40 | 800 | 1 | 12.5 |
| 1B | 20 | 20 | 750 | 1 | 14.0 |
| 1C | 20 | 20 | 750 | 1 | 13.5 |
| 1D | 20 | 20 | 750 | 1 | 13.8 |

Step 1C: Preparation of CZTS-Epoxy Composite

Epoxy set resin 145-20005 (10.0-20.0 g), epoxy set hardener 145-20020 (1.2-2.4 g), and one to five CZTS ingots (5.0-12.0 grams) were placed into a 20-mL mounting cup (Allied High Tech Products, Inc. Rancho Dominguez, Calif., 90220) having a diameter of 3.175 cm (1¼ inch) for a curing time of 8 h. After curing, the CZTS-Epoxy composite was obtained. Table 2 summarizes number of ingots used, amount of epoxy set resin and epoxy set hardener for three batches.

TABLE 2

Preparation of CZTS-Epoxy composite

| Batch # | Number of CZTS Ingots used | Total amount of Ingots (g) | Amount of epoxy set resin 145-20005 (g) | Amount of epoxy set hardener 145-20020 (g) |
|---|---|---|---|---|
| 1E | 1 | 5.0 | 10.0 | 1.2 |
| 1F | 1 | 12.0 | 20.0 | 2.4 |
| 1G | 5 | 9.7 | 20.0 | 2.4 |

Step 1D: Preparation of CZTS Wafers from the CZTS-Epoxy Composite

The CZTS-Epoxy composite prepared in Step 1C was mounted on a mechanical saw, IsoMet® Low Speed Saw, Model #11-1280-160 from Buehler (Lake Bluff, Ill.) and was cut into 3 to 5 wafers varying in thickness from 50 to 250 microns. The CZTS wafer formed by cutting the ends of the composite had exposed CZTS on one side, whereas other CZTS wafers had exposed CZTS on both sides.

Example 2

Preparation of CZTSe Wafers

Step 2A: Synthesis of CZTSe ($Cu_2ZnSn(S+Se)_4$) Crystals

Copper powder (1.01 g, 0.0159 mol); nano-zinc (0.52 g, 0.00797 mol); tin nanopowder (0.95 g, 0.00797 mol) and; selenium (3.78 g, 0.0479 mol); CsCl (27.16 g); KCl (6.50 g); and NaCl (6.34 g) were mixed together by shaking by hand for 15 min in a dry box to form a mixture. The mixture was placed in a 50-mL alumina boat, and heated in a tube furnace with nitrogen flow at 600° C. for 24 h. The furnace was cooled to room temperature and then the boat was removed and immersed in 500 mL of distilled water. Black crystalline material was filtered off, washed with an additional 500 mL of water, and dried at 1-mm vacuum for 12 h. The purity of CZTSe crystals was evaluated by X-ray powder diffraction using Rietveld refinement and was found to be in the range of 90-95%.

Step 2B: Preparation of CZTSe Ingots

CZTSe crystals (10.0 grams) prepared supra; CsCl (27.16 g); KCl (6.5 g); and NaCl (6.34 g) were placed in a 50-mL alumina boat. The alumina boat was placed in a quartz tube having a diameter of 6.35 cm (2.5 inches) under nitrogen flow.

The mixture of CZTSe crystals, CsCl, KCl, and NaCl in the alumina boat was heated to 800° C. and kept at this temperature for 1 day. Upon cooling to ambient temperature, the solidified mixture had ingots of CZTSe up to 1 cm in length, along with some crystalline and amorphous materials. The crystalline and amorphous materials comprised CZTS with some decomposition products, such as, copper selenides, tin selenides, and zinc selenides. The crystalline and amorphous materials which were not ingots were discarded and not used in further experiments. The boat containing the solidified mixture was placed into 1 L of distilled water to dissolve CsCl, KCl and NaCl. The residue was washed twice with 500 mL of distilled water and dried in 1-mm vacuum for 24 h. The CZTSe ingots were mechanically removed using tweezers from the mixture to determine the yield of 7.2 grams (72%).

Step 2C: Preparation of CZTSe-Epoxy Composite

Epoxy set resin 145-20005 (20.0 grams), epoxy set hardener 145-20020 (2.4 grams), and four CZTSe ingots (6.2 grams) were placed into a 20-mL mounting cup (Allied High Tech Products, Inc. Rancho Dominguez, Calif., 90220) having a diameter of 3.175 cm (1¼ inch) for a curing time of 8 h. After curing, CZTSe in the epoxy formed a composite.

Step 2D: Preparation of CZTSe Wafers from the CZTSe-Epoxy Composite

The CZTSe-epoxy composite was mounted on a mechanical saw, IsoMet® Low Speed Saw, Model #11-1280-160 from Buehler (Lake Bluff, Ill.) and was cut into 3 to 5 composite wafers varying in thickness from 50 to 250 microns. The CZTSe wafer formed by cutting the ends of the composite had exposed CZTSe on one side, whereas other CZTSe wafers had exposed CZTSe on both sides.

What is claimed is:

1. An article having a top surface and a bottom surface, the article comprising at least one quaternary chalcogenide ingot mounted in a non-conductive polymer binder, such that the at least one quaternary chalcogenide ingot is exposed on both the top surface and the bottom surface.

2. The article of claim 1, wherein the quaternary chalcogenide ingots are selected from the group consisting of $Cu_2ZnSnS_4$ (CZTS); $Cu_2ZnSnSe_4$ (CZTSe); and $Cu_2ZnSn(S_a,Se_{1-a})_4$, where $0 \leq a \leq 1$ (CZTS/Se).

3. The article of claim 1, wherein the polymer binder comprises an epoxy, an acrylic, polysiloxanes, or mixtures thereof.

4. The article of claim 1, wherein the article is in the form of a wafer.

* * * * *